(12) United States Patent
Zhang et al.

(10) Patent No.: US 10,164,590 B2
(45) Date of Patent: Dec. 25, 2018

(54) DIGITAL PWM MODULATOR

(71) Applicant: Cirrus Logic International Semiconductor Ltd., Edinburgh (GB)

(72) Inventors: Lingli Zhang, Austin, TX (US); Yongjie Cheng, Austin, TX (US); Lei Zhu, Austin, TX (US); Christian Larsen, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/910,774

(22) Filed: Mar. 2, 2018

(65) Prior Publication Data

US 2018/0254757 A1   Sep. 6, 2018

Related U.S. Application Data

(60) Provisional application No. 62/466,450, filed on Mar. 3, 2017.

(51) Int. Cl.
*H03F 3/217* (2006.01)
*H03F 3/183* (2006.01)

(52) U.S. Cl.
CPC ............ *H03F 3/217* (2013.01); *H03F 3/183* (2013.01); *H03F 2200/03* (2013.01); *H03F 2200/351* (2013.01)

(58) Field of Classification Search
None
See application file for complete search history.

(56) References Cited

U.S. PATENT DOCUMENTS

| | | | | |
|---|---|---|---|---|
| 8,022,756 B2* | 9/2011 | Walker | .................... | H03F 3/217 330/10 |
| 2005/0046478 A1* | 3/2005 | Ohara | ....................... | H03F 1/26 330/251 |
| 2010/0045376 A1* | 2/2010 | Soenen | ................. | H03F 3/2173 330/251 |
| 2012/0025910 A1* | 2/2012 | Jiang | ....................... | H03F 3/217 330/251 |
| 2018/0041173 A1* | 2/2018 | Marchais | .................. | H03F 1/32 |

* cited by examiner

*Primary Examiner* — Paul Huber
(74) *Attorney, Agent, or Firm* — Norton Rose Fulbright US LLP

(57) ABSTRACT

An improved Class-D amplifier may include a digital PWM modulator that receives a digital audio signal and that provides a PWM signal as an input to an analog PWM modulator of the Class-D amplifier. A digital PWM modulator may be configured to receive a digital signal and to generate a first PWM signal based on the digital signal. A digital PWM driver may be coupled to the digital PWM modulator. The digital PWM driver may be configured to receive the first PWM signal and to generate a reference PWM signal based on the first PWM signal. An analog PWM modulator may be coupled to the digital PWM driver. The analog PWM modulator may be configured to receive the reference PWM signal and to generate an output PWM signal based on the reference PWM signal.

28 Claims, 12 Drawing Sheets

DIGITAL PWM MODULATOR

CROSS REFERENCE TO RELATED APPLICATIONS

This application claims the benefit of U.S. Provisional Patent Application No. 62/466,450 entitled "Digital Pulse Width Modulation (PWM) Modulator Feeding an Analog PWM Modulator of a Class-D Amplifier," filed on Mar. 3, 2017, which is expressly incorporated by reference herein in its entirety. This application is related to subject matter disclosed in U.S. patent application Ser. No. 15/582,257 to Yongjie Cheng et al., filed on Apr. 28, 2017 and entitled "Control of Switches in a Variable Impedance Element," which is expressly incorporated by reference herein in its entirety.

FIELD OF THE DISCLOSURE

The instant disclosure relates to audio amplification. More specifically, portions of this disclosure relate to audio amplification in which a digital PWM modulator feeds an analog PWM modulator of a Class-D amplifier.

BACKGROUND

Class-D audio amplifiers are desirable in audio systems because they are efficient and because they can handle high power signals. The high efficiency allows for smaller power supplies and smaller heat sinks. Typically, a switching output stage of a Class-D amplifier is driven by a pulse width modulation (PWM) modulator that outputs a one-bit signal that represents two voltage levels that can be output by the switching output stage. The one-bit voltage signal output by the switching output stage is typically filtered through a simple low-pass filter (LPF) and driven into a speaker.

FIG. 1 is a schematic block diagram illustrating an open-loop digitally-driven Class-D amplifier 100 according to the prior art. In FIG. 1, digital PWM modulator 104 converts the signal output by delta-sigma modulator (DSM) 102 to a PWM signal. The PWM signal output by digital PWM modulator 104 is used by drivers 106 to control the output stage of a Class-D amplifier. The open-loop digitally-driven Class-D amplifier illustrated in FIG. 1 has numerous drawbacks. For example, the non-idealities of the power switches of drivers 106, such as dead time, signal-dependent delays, and slew rate, act as sources of distortion and may add extra noise to the overall Class-D system. In addition, open-loop digitally-driven Class-D amplifiers have a near-zero Power Supply Rejection Ratio (PSRR) for a non-regulated power supply. Low PSRR leads to possible audible artifacts.

Analog closed-loop Class-D amplifiers have been used to address some issues present in open-loop digitally-driven Class-D amplifiers such as shown in FIG. 1. FIG. 2A is a schematic block diagram illustrating a closed-loop analog-driven Class-D amplifier 200 according to the prior art. In FIG. 2A, an analog PWM modulator (Delta-Sigma Modulator 202) receives an analog input voltage $V_{IN}$ and receives a feedback voltage fed back from a PWM output power stage 204. The difference between the analog input voltage $V_{IN}$ and the feedback voltage is passed through a loop filter of the Delta-Sigma Modulator 202, which includes integrators and a PWM conversion block, followed by the PWM output power stage 204. The closed-loop nature of this topology allows for reduction in distortion from the non-idealities of the power switches, such as dead time, signal-dependent delays, and slew rate, get corrected. In addition, the PSRR of the overall Class-D system illustrated in FIG. 2A is improved over the open-loop Class-D system illustrated in FIG. 1. Therefore, a non-regulated power supply ripple is no longer an issue.

One drawback associated with the closed-loop analog-driven Class-D amplifier 200 is that a digital-to-analog converter (DAC) is needed to provide the analog input to the closed-loop analog-driven Class-D amplifier 200. This DAC is needed when, for example, a digital signal processor (DSP) is used to process data and generate the audio signal for input to the amplifier. After the audio signal has been processed, a DAC is used to convert the digital audio signal to a continuous-time voltage waveform that can be received by the closed-loop analog-driven Class-D amplifier 200.

FIG. 2B is a schematic block diagram illustrating another closed-loop analog-driven Class-D amplifier 250 according to the prior art in which the analog input signal of the analog PWM modulator of the Class-D amplifier is provided by a DAC. The DAC illustrated in FIG. 2B may be a switched-capacitor DAC (SC-DAC) or a current-steering DAC or a R-2R DAC. The DAC adds extra noise to the overall Class-D amplifier system and limits the optimization of the integrator gain of the analog PWM modulator. In addition, due to the switching nature of the feedback signal and the slow moving DAC output signal, the error signal between the input signal and the feedback signal are integrated through the integrators of the analog PWM modulator, which is illustrated in FIGS. 3A and 3B.

FIGS. 3A and 3B are plots illustrating signals processed within an analog PWM modulator of a Class-D amplifier according to the prior art. In FIG. 3A, the differential analog input signal provided as an input to the analog PWM modulator is represented by signals 312A and 312B and is shown as having a 1 V differential DC voltage. The differential feedback voltage signal that is fed back from a PWM output power stage, and that is also provided as an input to the analog PWM modulator, is represented in FIG. 3A by signals 314A and 314B. In FIG. 3B, signals 322A and 322B represent the output voltage signals of a first integrator of an analog PWM modulator that receives the input voltage signal and the feedback voltage signal, respectively. The output swing of the first integrator of the analog PWM modulator is represented by signal 324. As illustrated in FIG. 3B, the peak-to-peak output swing of signal 324 may be as high as 1 V. Because the gain of the first integrator of the analog PWM modulator is limited by an allowable inherent voltage swing at the output of the first integrator in the analog PWM modulator, the 1 V output swing that results from only the error signal between the input voltage signal and the feedback voltage signal limits the overall gain that can be used for the integrator.

FIGS. 3A and 3B illustrate that because the error between the input signal and the feedback signal is integrated through the integrators of the analog PWM modulator, the gain of the integrators is limited to prevent signal clipping. Because increasing the gains of the integrators allows reducing the resistance or its equivalent provides one mechanism for reducing the noise floor in a closed-loop analog-driven Class-D amplifier, the limitation on the gain as a result of the use of a DAC also limits the noise floor that can be achieved with the closed-loop analog-driven Class-D amplifier. In other applications, the size of the passive components of an electronic device may be increased to reduce the noise floor. However, in conventional Class-D amplifiers, such as the Class-D amplifiers illustrated in FIGS. 1 and 2A-B, scaling of the passive components sizes of Class-D amplifiers to reduce the noise floor is not feasible, because such scaling will increase power and silicon area beyond allowable limits.

Shortcomings mentioned here are only representative and are included simply to highlight that a need exists for improved electrical components, particularly for improved audio amplifiers, such as audio amplifiers that may be used in mobile devices. Embodiments described herein address certain shortcomings but not necessarily each and every one described here or known in the art.

SUMMARY

An improved Class-D amplifier may include a digital PWM modulator that receives a digital audio signal and that provides a PWM signal as an input to an analog PWM modulator. A digital PWM driver follows the digital PWM modulator. Thus, embodiments of the Class-D amplifier may receive, without need of a DAC, an output from a digital signal processor (DSP) that processes an audio signal for reproduction at a transducer. In some embodiments, the amplifier includes a closed-loop feedback that reduces signal swing at an integrator of the amplifier, allowing the gain of the integrator to be increased to obtain a lower idle channel noise without area and power penalty. The improved Class-D amplifier of this disclosure may provide ultra-low idle channel noise and distortion while maintaining a high first-integrator gain, occupying minimal silicon area, and consuming little power.

According to one embodiment, an apparatus may include: a digital PWM modulator that is configured to receive a digital signal and generate a first PWM signal based, at least in part, on the digital signal; a digital PWM driver that is coupled to the digital PWM modulator and that is configured to receive the first PWM signal and generate a reference PWM signal based, at least in part, on the first PWM signal; and an analog PWM modulator that is coupled to the digital PWM driver and that is configured to receive the reference PWM signal and generate an output PWM signal based, at least in part, on the reference PWM signal.

In another embodiment, a method includes: receiving, with a digital pulse width modulation (PWM) modulator, a digital signal; generating, with the digital PWM modulator, a first PWM signal based, at least in part, on the digital signal; generating, with a digital PWM driver that is coupled to the digital PWM modulator, a reference PWM signal based, at least in part, on the first PWM signal; and generating, with an analog PWM modulator that is coupled to the digital PWM driver, an output PWM signal based, at least in part, on the reference PWM signal.

In yet another embodiment, an apparatus may include an audio controller configured to perform steps that include: receiving, with a digital pulse width modulation (PWM) modulator, a digital signal; generating, with the digital PWM modulator, a first PWM signal based, at least in part, on the digital signal; generating, with a digital PWM driver that is coupled to the digital PWM modulator, a reference PWM signal based, at least in part, on the first PWM signal; and generating, with an analog PWM modulator that is coupled to the digital PWM driver, an output PWM signal based, at least in part, on the reference PWM signal.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed systems and methods, reference is now made to the following descriptions taken in conjunction with the accompanying drawings. In the appended figures, similar components or features may have the same reference label. Further, various components of the same type may be distinguished by following the reference label with a second label that distinguishes among the similar components. If just the first reference label is used in the specification, the description is applicable to any one of the similar components having the same first reference label irrespective of the second reference label.

DETAILED DESCRIPTION

Figure 1:
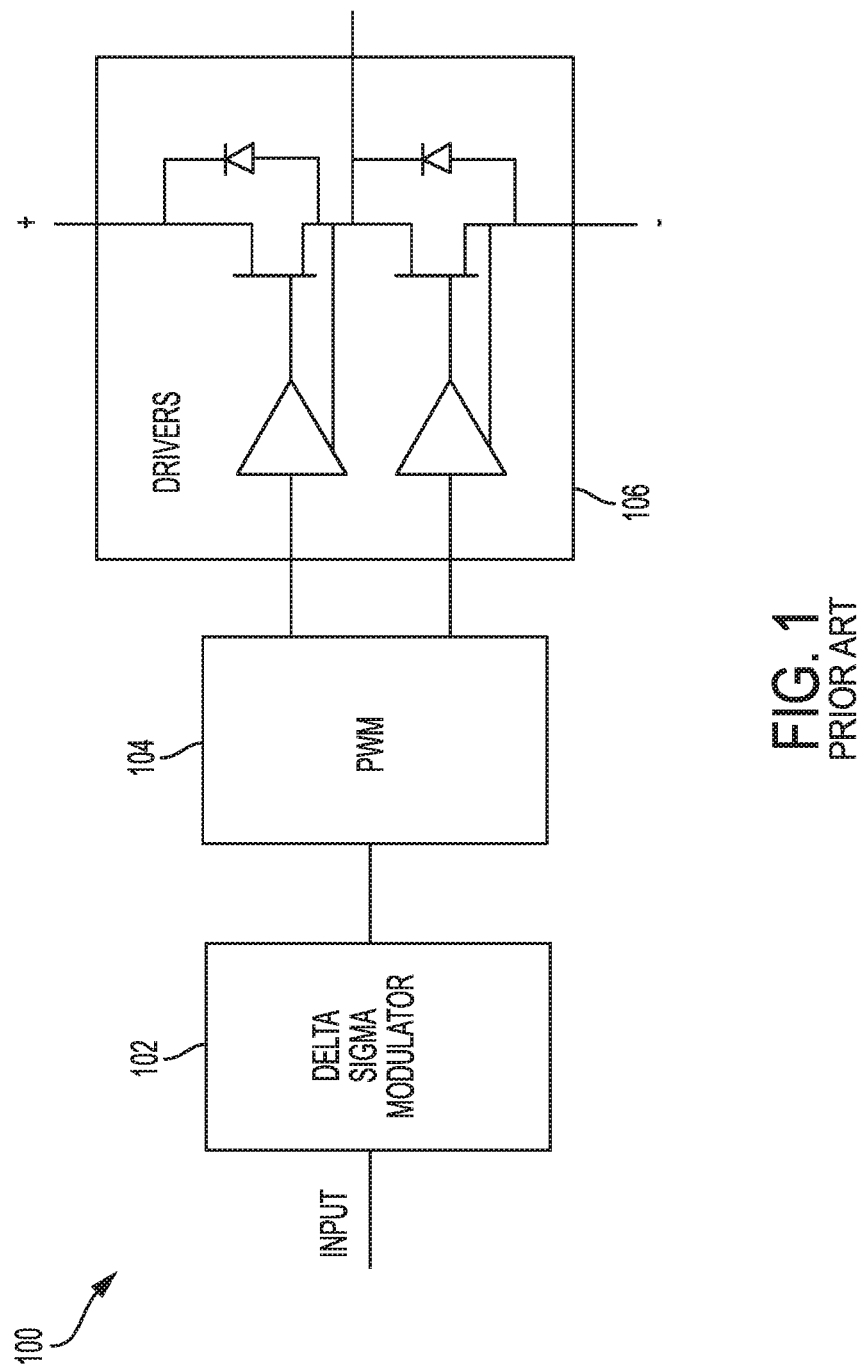
FIG. 1 is a schematic block diagram illustrating an open-loop digitally-driven Class-D amplifier according to the prior art.
Figure 2A:
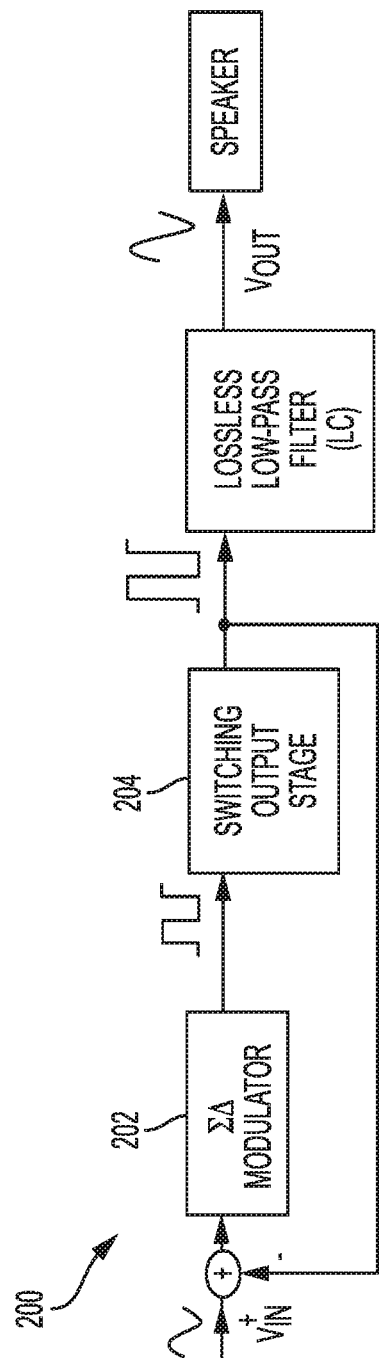
FIG. 2A is a schematic block diagram illustrating a closed-loop analog-driven Class-D amplifier according to the prior art.
Figure 2B:
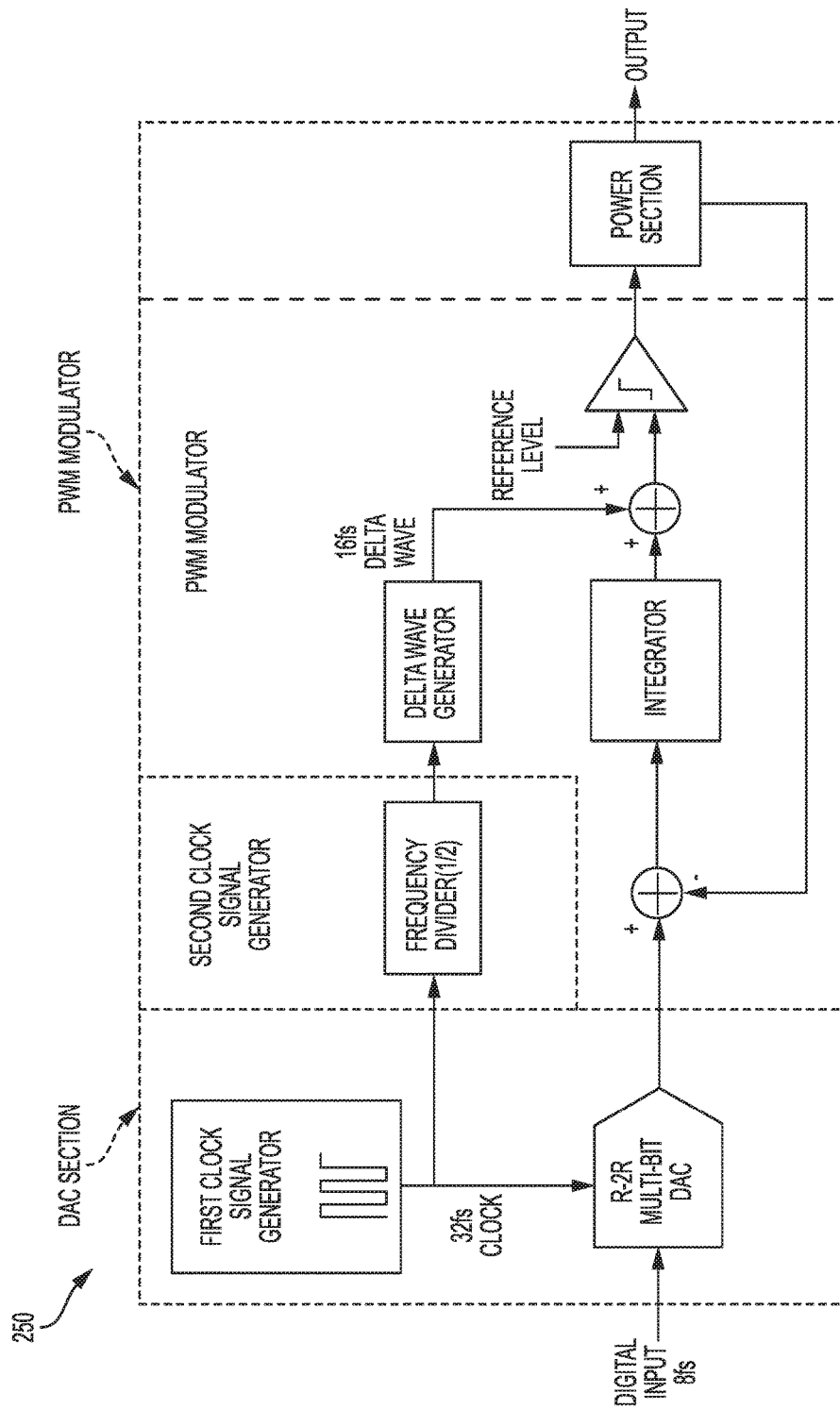
FIG. 2B is a schematic block diagram illustrating another closed-loop analog-driven Class-D amplifier according to the prior art in which the analog input signal of the analog PWM modulator of the Class-D amplifier is provided by a DAC.
Figure 3A:
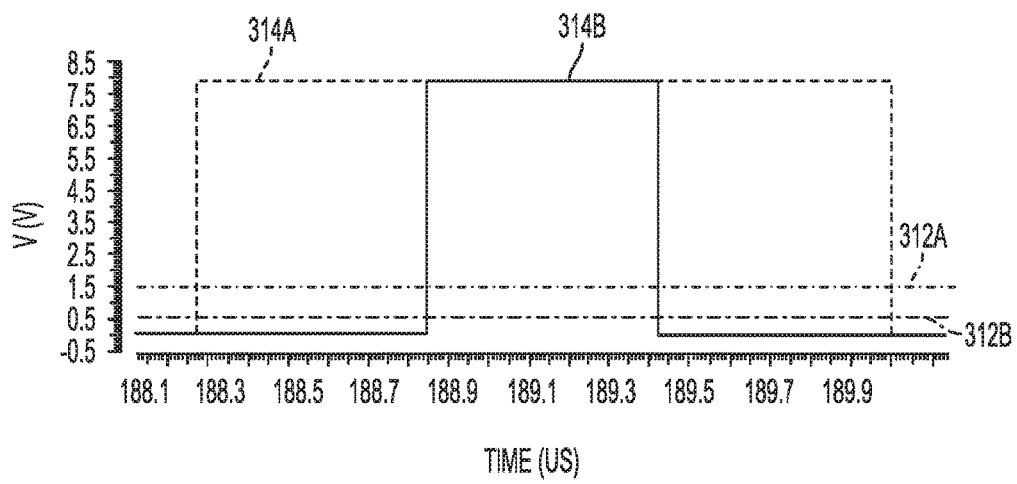
FIGS. 3A and 3B are plots illustrating signals processed within an analog PWM modulator of a Class-D amplifier according to the prior art.
Figure 3B:
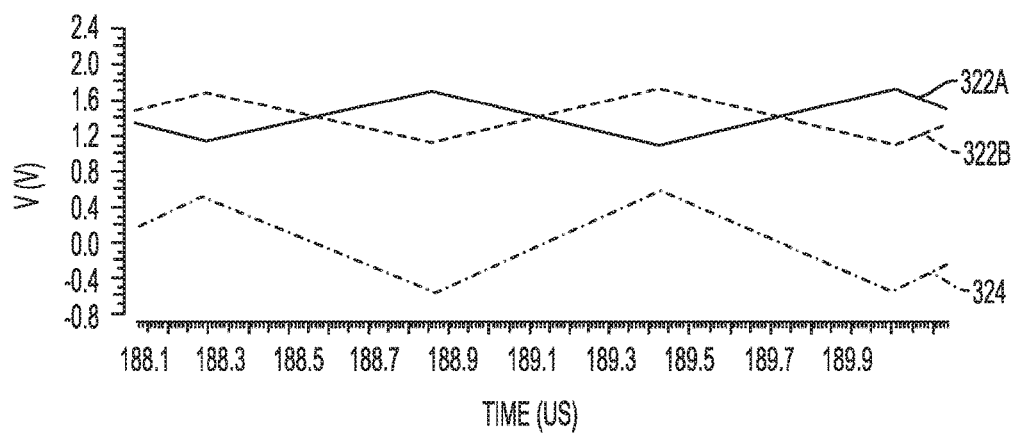
Figure 4A:
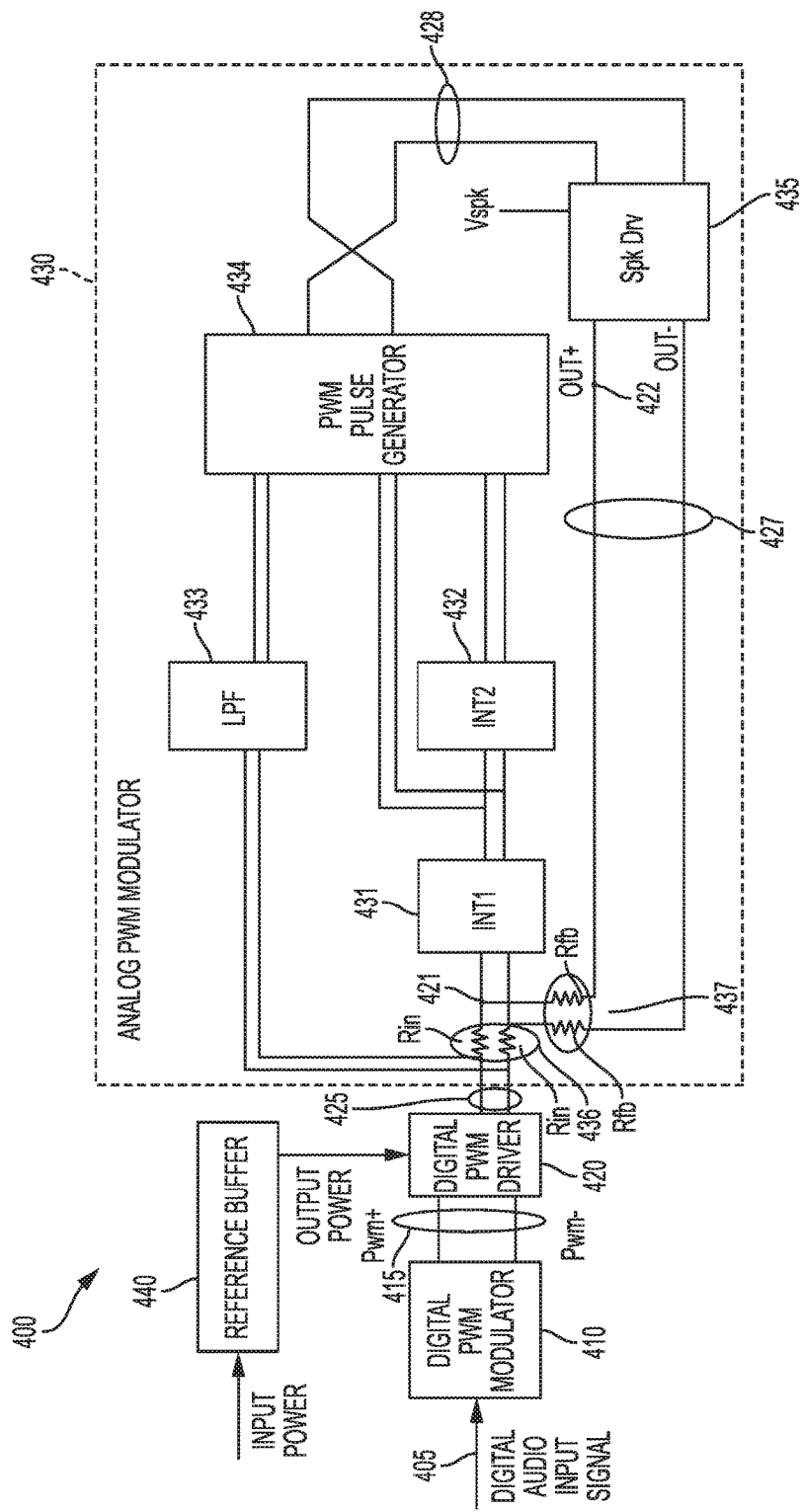
FIG. 4A is a schematic block diagram illustrating a Class-D amplifier system according to some embodiments of the disclosure.

FIG. 4A is a schematic block diagram illustrating a Class-D amplifier system according to some embodiments of the disclosure. The Class-D amplifier system 400 includes a digital PWM modulator 410, a digital PWM driver 420, an analog PWM modulator 430, and a reference buffer 440. A digital PWM modulator 410 receives a digital audio input signal 405 and generates a PWM signal 425 for input to an analog PWM modulator 430. In some embodiments, the Class-D amplifier system 400 may provide ultra-low idle noise without increasing the die area or power of the Class-D amplifier system 400 beyond acceptable levels.

The digital PWM modulator 410 may be configured to receive a digital audio input signal 405. For example, the digital audio input signal 405 may be a digital signal representing an audio signal. In some embodiments, the digital audio input signal 405 may be a digital signal output by a DSP. In another embodiment, the digital audio input signal 405 may be a digital signal output by a Delta-Sigma Modulator (DSM).

The digital PWM modulator 410 is configured to generate a first PWM signal 415 based, at least in part, on the digital signal 405. For example, the digital PWM modulator 410 may convert the digital audio input signal 405 to the first PWM signal 415 by varying the duty cycle of the waveform output by the digital PWM modulator 410. In some embodiments, a digital PWM modulator 410 refers to a functional block that receives digital input signals and that outputs a signal that includes numerous pulses, wherein the widths of the pulses of the output signal are varied by the digital PWM modulator based on the digital input signals. In some embodiments, the first PWM signal 415 output by the digital PWM modulator 410 may be a differential PWM signal. The digital PWM driver 420 may be coupled to the digital PWM modulator 410 to receive the first PWM signal 415 output by the digital PWM modulator 410.

The digital PWM driver 420 may be configured to generate a reference PWM signal 425 based, at least in part, on the first PWM signal 415. For example, the PWM driver 420 may be configured to drive current through at least one of a plurality of resistors 436 that interface the digital PWM driver 420 with the analog PWM modulator 430. The digital PWM driver 420 may be configured to generate the reference PWM signal 425 by driving current through at least one of a plurality of resistors 436. The reference PWM signal 425 generated by the digital PWM driver 420 may be provided as an input to the analog PWM modulator 430. According to one embodiment, the reference PWM signal may be a voltage signal. According to another embodiment, the reference PWM signal may be a current signal.

Class-D amplifier system 400 also includes a reference buffer 440. The reference buffer 440 may be coupled to the digital PWM driver 420. The reference buffer 440 may be a power supply block configured to receive input power and configured to provide output power to the digital PWM driver 420 to power the digital PWM driver 420.

The analog PWM modulator 430 of the Class-D amplifier system 400 may be coupled to the digital PWM driver 420 and to receive the reference PWM signal 425. In FIG. 4A, the analog PWM modulator 430 may receive the reference PWM signal 425 as an input through a first integrator 431. In addition, the analog PWM modulator 430 may also receive the reference PWM signal 425, or an attenuated version of the reference PWM signal 425, as an input to a LPF 433. The path of the reference PWM signal 425 through the LPF 433 to the PWM pulse generator 434 may be referred to as a feed-forward path of the reference PWM signal 425 in the analog PWM modulator 430, wherein the reference PWM signal 425 is directly fed forward to the PWM pulse generator 434 through the LPF 433.

The analog PWM modulator 430 may be configured to generate, using speaker driver 435, an output PWM signal 427 based, at least in part, on the reference PWM signal 425. For example, the analog PWM modulator 430 may also include an analog PWM pulse generator 434 and a speaker driver 435, both of which may be used to generate the output PWM signal 427. In some embodiments, the output PWM signal 427 generated by the analog PWM modulator 430 may be output to other components through which the audio signal is eventually made audible to a human. For example, the output PWM signal 427 output by the speaker driver 435 of the analog PWM modulator 430 may be output to a LPF (not shown) and then to a speaker or other transducer (not shown) that converts the signal to sound that is audible to a human.

In some embodiments, the analog PWM pulse generator 434 may be a functional block that receives analog signals and that outputs a signal that includes numerous pulses, wherein the widths of the pulses of the output signal are varied by the analog PWM pulse generator 434 based on the analog signals input to the analog PWM pulse generator 434. The analog PWM pulse generator 434 may receive input signals through integrators 431 and 432 or through a LPF 433. The analog PWM pulse generator 434 may also receive as an input signal a signal output by a second integrator 432 after the second integrator 432 has processed the signal output by the first integrator 431. The analog PWM pulse generator 434 may further receive a signal output by a LPF 433 after the LPF 433 has processed the reference PWM signal 425.

Based on the received input signals, the analog PWM pulse generator 434 may generate a fourth PWM signal 428. The fourth PWM signal 428 may be received as an input by the speaker driver 435. In some embodiments, the speaker driver 435 may operate on a voltage level that is higher than many of the other functional blocks within the Class-D amplifier system 400, such as the digital PWM modulator 410, the digital PWM driver 420, the integrators 431 and 432, the LPF 433, and/or the analog PWM pulse generator 434. For example, the speaker driver 435 may operate on a voltage level $V_{spk}$. In some embodiments, voltage level Vspk may be a voltage that is higher than the voltage used to operate other blocks of the Class-D amplifier system 400, such as the digital PWM modulator 410, the digital PWM driver 420, the integrators 431 and 432, the LPF 433, and/or the analog PWM pulse generator 434.

As illustrated in FIG. 4A, the speaker driver 435 may be configured to generate the output PWM signal 427. In some embodiments, the speaker driver 435 may receive the fourth PWM signal 428 output by the analog PWM pulse generator 434 and amplify the amplitude of the fourth PWM signal 428 to generate the output PWM signal 427. Because the fourth PWM signal 428 is determined based on the reference PWM signal 425, the functionality of the speaker driver 435 may also be described as an amplification of the reference PWM signal 425. The output PWM signal 427 may also be differential signal, such as when the reference PWM signal 425 is a differential signal. In some embodiments, the in-band amplitude of the output PWM signal may be greater than or equal to the amplitude of the reference PWM signal.

The analog PWM modulator 430 may also be configured to add opposite polarities of the reference PWM signal 425 and the output PWM signal 427 to generate an error signal. For example, the analog PWM modulator 430 may include feedback resistors 437 having resistance $R_{fb}$, different from a resistance $R_{in}$ value of resistors 436, through which the output PWM signal 427 may be fed back to the input of the first integrator 431. The first integrator 431 of the analog PWM modulator 430 may receive the reference PWM signal 425 as an input through the driving of current by the digital PWM driver 420 through at least one of a plurality of resistors 436. Therefore, both the output PWM signal 427 and the reference PWM signal 425 may be provided as inputs to the first integrator 431 through the feedback resistors 437 and at least one of a plurality of input resistors 436, respectively. To obtain an error signal in which the reference and output PWM signals cancel each other out, the output PWM signal 427 may be fed back to the input of the first integrator 431 such that the positive terminal of the output PWM signal 427 is coupled to the same node that the negative terminal of the reference PWM signal 425 is coupled. For example, in FIG. 4A, if terminal 421 is the negative terminal of the digital PWM driver 420 such that terminal 421 is the negative terminal of the reference PWM signal 420, then terminal 422, the positive terminal of the speaker driver 435, may be fed back to the input of the first integrator 431 such that terminal 421 and terminal 422 are coupled to the same input terminal of the first integrator 431. In some embodiments, the resulting error signal may have a peak-to-peak voltage amplitude that is in the range of 0 to 200 mV. According to some embodiments, the instantaneous error may still be a full-signal-level error. However, the out-of-phase feedback signal may allow most of the integral of the error to be canceled.

In some embodiments, at the input of the analog PWM modulator 430, i.e., at the input of the first integrator 431, the voltage level of the reference PWM signal 425 may be modified to match the voltage level of the output PWM signal 427 such that the reference PWM signal 425 and the output PWM signal 427 cancel each other. Therefore, the digital PWM driver 420 may be configured to amplify the first PWM signal 415 such that the generated reference PWM signal 425 has an amplitude that is approximately equal to the amplitude of the output PWM signal 427. In some embodiments, the voltage levels of the output PWM signal 427 may vary. Therefore, to be able to match various voltage levels of the output PWM signal 427, the Class-D amplifier system 400 may be made adjustable such that the amplification of the first PWM signal 415 may be adjusted such that the voltage level of the reference PWM signal 425 output by the digital PWM driver 420 is approximately equal to the voltage level of the output PWM signal 427.

Figure 4B:
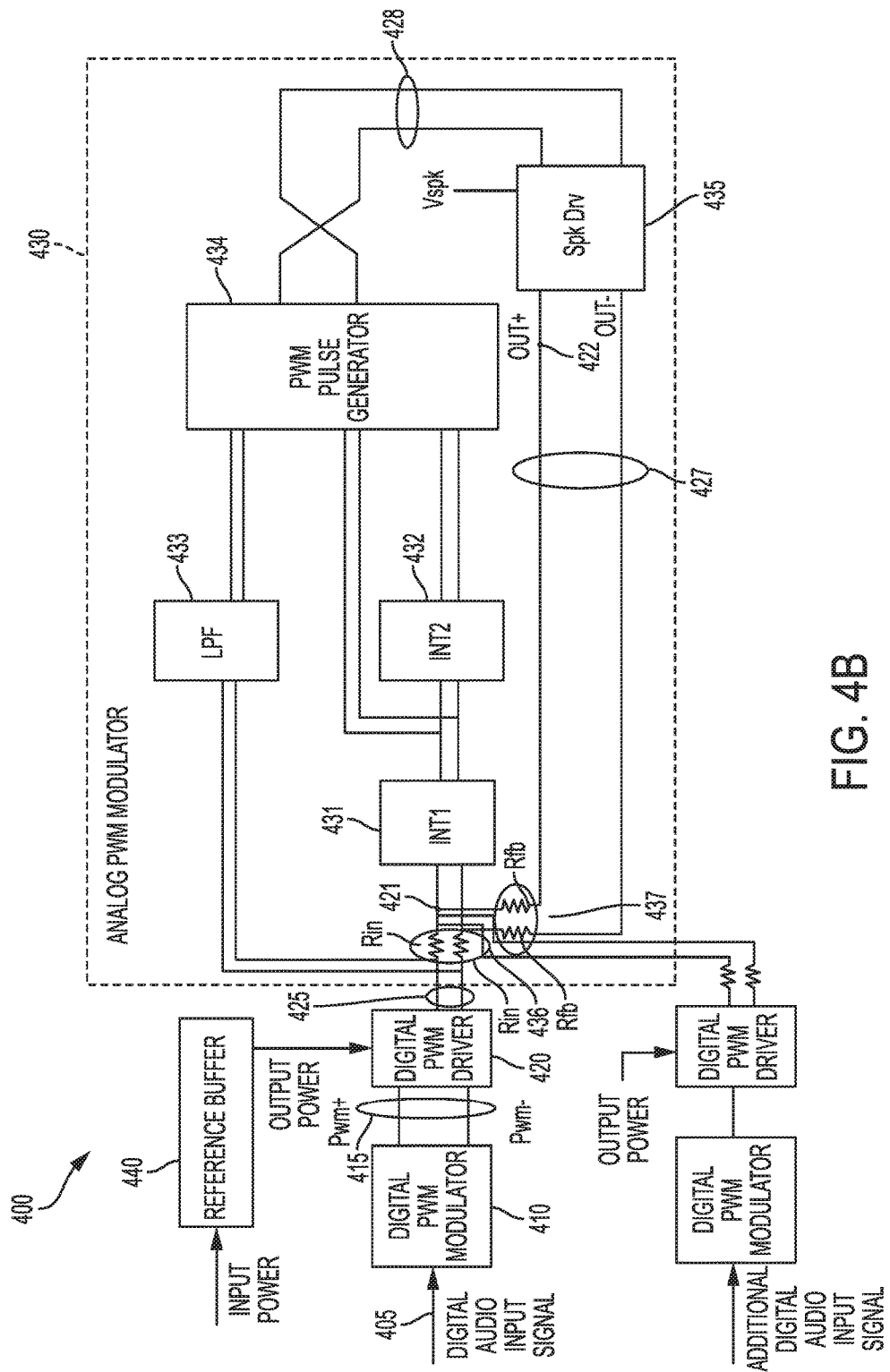
FIG. 4B is a schematic block diagram illustrating another Class-D amplifier system according to some embodiments of the disclosure.

FIG. 4B is a schematic block diagram illustrating another Class-D amplifier system according to some embodiments of the disclosure. In particular, FIG. 4B illustrates an expansion of the Class-D amplifier system of FIG. 4A to include multiple digital PWM modulator outputs followed by their related digital PWM drivers. Therefore, as illustrated in FIG. 4B, in general a Class-D amplifier system of this disclosure may include more than one digital PWM modulator output(s) and corresponding digital PWM driver(s). In some embodiments, the additional digital PWM modulator(s) and corresponding digital PWM driver(s) may operate in a similar fashion as digital PWM modulator 410 and digital PWM driver 420.

Figure 5:
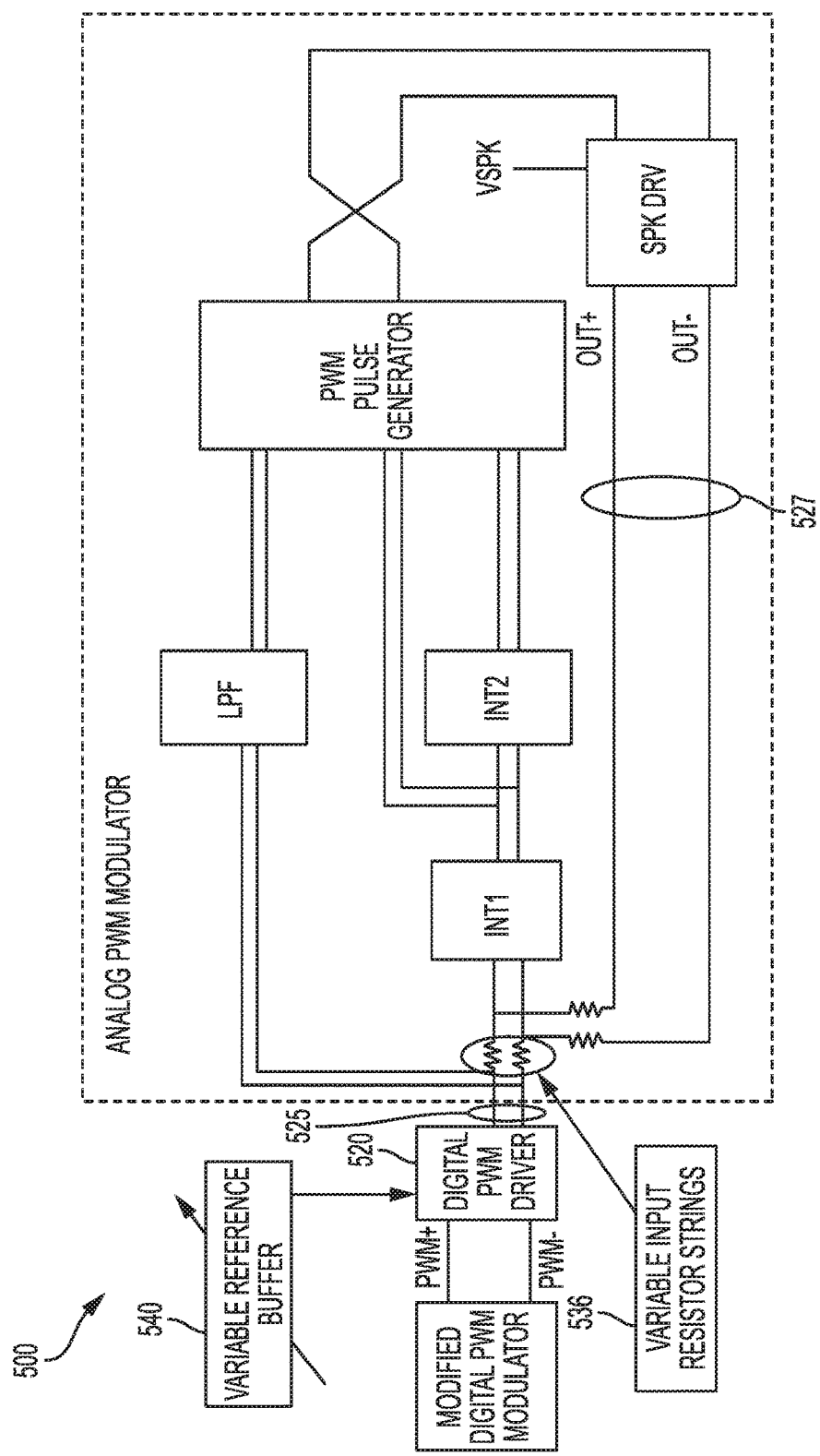
FIG. 5 is a schematic block diagram illustrating an adjustable Class-D amplifier system according to some embodiments of the disclosure.

FIG. 5 is a schematic block diagram illustrating an adjustable Class-D amplifier system according to some embodiments of the disclosure. The adjustable Class-D amplifier system 500 illustrated in FIG. 5 is similar to the Class-D amplifier system 400 illustrated in FIG. 4 with the additional functionality of adjustability to adjust the voltage level of the reference PWM signal 525. In some embodiments, to adjust the voltage level of the reference PWM signal 525, the adjustable Class-D amplifier system 500 may include a variable reference buffer 540 and/or a variable input resistor string 536.

In one embodiment, the variable reference buffer 540 may be configured to have a configurable output supply voltage such that a voltage supplied to the digital PWM driver 520 is configurable. When the output PWM signal 527 has a voltage level higher than the reference PWM signal 525, the variable reference buffer 540 may be configured to increase the voltage provided to the digital PWM driver 520 such that the reference PWM signal 525 generated by the digital PWM driver 520 has a voltage amplitude that is approximately equal to the voltage amplitude of the output PWM signal 527. The variable reference buffer 540 may be configured to track an average level of the voltage signals of the output PWM signal 527, and then modify the voltage supplied to the digital PWM driver 520 based on the average level of the voltage signals of the output PWM signal 527.

Figure 6:
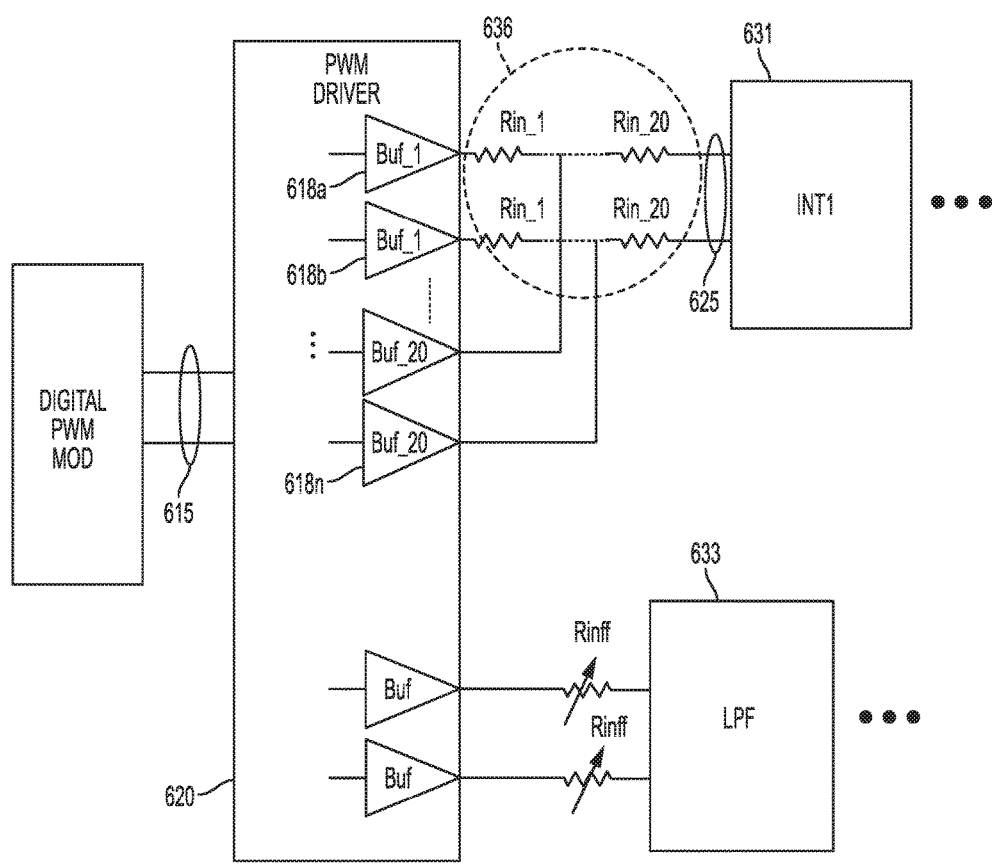
FIG. 6 is a schematic block diagram illustrating a digital PWM driver driving current through an input resistor string according to some embodiments of the disclosure.

FIG. 6 is a schematic block diagram illustrating a digital PWM driver driving current through an input resistor string according to some embodiments of the disclosure. A digital PWM driver 620 and variable input resistor string 636 may be used to adjust the voltage level of the reference PWM signal 625. A digital PWM driver 620 may include one or more inverters or buffers 618a-n to drive the resistors 636. The one or more inverters or buffers 618 may be powered by a reference buffer, such as the reference buffer 440 illustrated in FIG. 4 or the variable reference buffer 540 illustrated in FIG. 5. In some embodiments, the one or more inverters or buffers 618 in the digital PWM driver 620 illustrated in FIG. 6 may also be used in the digital PWM drivers illustrated in FIGS. 4 and 5 to drive the resistors illustrated in FIGS. 4 and 5. Additionally, in some embodiments, the variable input resistor string 636 illustrated in FIG. 6 may be used as the variable input resistor string illustrated in FIG. 5 and/or the at least one of a plurality of resistors illustrated in FIG. 4.

The digital PWM driver 620 and the variable resistor string 636 may operate together to adjust the voltage level of the reference PWM signal 625. In other words, the digital PWM driver 620 and the variable resistor string 636 may operate together to vary the amplification of the voltage amplitude of the first PWM signal 615 such that the reference PWM signal 625 generated by the digital PWM driver 620 has a voltage amplitude that is approximately equal to the voltage amplitude of the fed back output PWM signal, such as output PWM signal 427 or 527. In particular, the digital PWM driver 620 may be configured to vary the amplification of the amplitude of the first PWM signal 615 by varying the at least one of the plurality of resistors 636 through which current is driven. As an example, to provide the reference PWM signal 625 to the input of the first integrator 631, the digital PWM driver 620 may include 20 different pairs of inverters or buffers 618 and 20 different pairs of input resistors 636 with each pair of input resistors having a different size. For example, the first resistor size $R_{in\_1}$ may correspond to a resistor size that generates a first gain, such as 1 dB, and the twentieth resistor size $R_{in\_20}$ may correspond to a resistor size that generates a higher gain, such as 20 dB. When the voltage level of the fed back output PWM signal, such as output PWM signal 427 or 527, is such that only an amplification of 1 dB is needed for the voltage amplitude level of the reference PWM signal 625 to approximately equal the voltage amplitude level of the fed back output PWM signal, then the digital PWM driver 620 may be configured to activate only buffers Buf_1 that drive resistors Rin_1 so that first PWM signal 615 is amplified by only 1 dB to generate the reference PWM signal 625 that has a voltage amplitude level that is approximately equal to the voltage amplitude level of the fed back output PWM signal. Similarly, when the voltage level of the output PWM signal is such that an amplification of 20 dB is needed for the voltage amplitude level of the reference PWM signal 625 to approximately equal the voltage amplitude level of the output PWM signal, then the digital PWM driver 620 may be configured to activate buffers Buf_20 that drive resistors Rin_20 so that first PWM signal 615 is amplified by 20 dB to generate the reference PWM signal 625 that has a voltage amplitude level that is approximately equal to the voltage amplitude level of the output PWM signal. As an example, when the digital PWM driver 620 is designed to output a signal having a voltage swing of 5 V to match the voltage swing of the output PWM signal, but the output PWM signal is subsequently output having a voltage swing of 10 V, the digital PWM driver 620 may, through varying of the variable reference buffer, such as variable reference buffer 540, or the activation of inverters 618, buffers 618, or resistors 636, be configured to adjust the voltage swing of the reference PWM signal 625 so that the voltage swing of the reference PWM signal 625 is also 10 V to match the adjusted voltage swing of the output PWM signal that is now also 10 V.

A person of skill in the art would readily recognize that although twenty resistor sizes are illustrated in FIG. 6 to represent twenty different gain steps, a different number of resistor sizes to represent a different number of gain steps may also be used for the variable input resistor string without departing from this disclosure in scope or spirit. Similarly, a number of corresponding pairs of inverters or buffers different than twenty may be used within the digital PWM driver without departing from this disclosure in scope or spirit. Moreover, a person of skill in the art would readily recognize that the maximum gain and the gain steps that can be achieved by the digital PWM driver and the variable input resistor string may be values different than 20 dB and 1 dB, respectively, without departing from this disclosure in scope or spirit.

Different inverters (or buffers) 618 and resistors 636 than those used to provide the reference PWM signal 625 as the input signal for the first integrator 631 may be used to provide the reference PWM signal 625 to the LPF 633. As illustrated in FIGS. 4 and 5, in some embodiments, the reference PWM signal may be provided to the LPF directly from the digital PWM driver. In other embodiments, the same inverters (or buffers) and resistors as those used to provide the reference PWM signal as the input signal for the first integrator may be used to provide the reference PWM signal to the LPF.

In some embodiments, because the input signals of an analog PWM modulator of a Class-D amplifier system of this disclosure may be provided with a digital PWM driver implemented with one or more inverters or buffers that drive resistors that interface to the analog PWM modulator, a DAC may not be needed to provide the input for the analog PWM modulator. As a result, Class-D amplifier systems of this disclosure may remove many of the drawbacks associated with using a DAC in a Class-D amplifier system to provide the input to an analog PWM modulator of the Class-D amplifier system.

In previous systems, switches typically were T-gates and were 6-volt devices in a 180 nm node. In addition, in previous systems, only one switch is typically enabled at one time and it is connected to a summing node that experiences large common-mode variation. Thus, such previous systems were very difficult to implement in a 55 nm process as a result of the associated device limitations. Typically, a sophisticated common-mode tracking system and charge pump was needed in previous systems to control $V_{gs}$ properties. The embodiments of this disclosure, however, do not suffer from the drawbacks of previous systems and therefore allow for enhanced gain switch implementations. Examples of the gain switches that may be used in FIGS. 4-6 are described in U.S. patent application Ser. No. 15/582,257 (hereafter referred to as the "'257 Application"), and the '257 Application is hereby incorporated by reference.

Figure 7A:
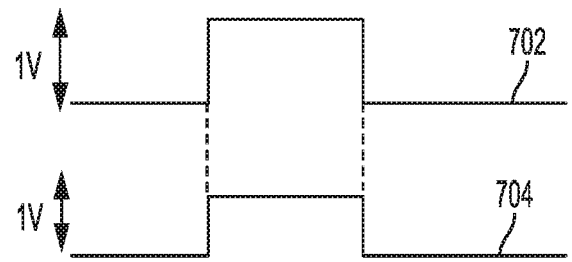
FIGS. 7A and 7B are plots illustrating the adjustability of a Class-D amplifier system according to some embodiments of the disclosure.
Figure 7B:
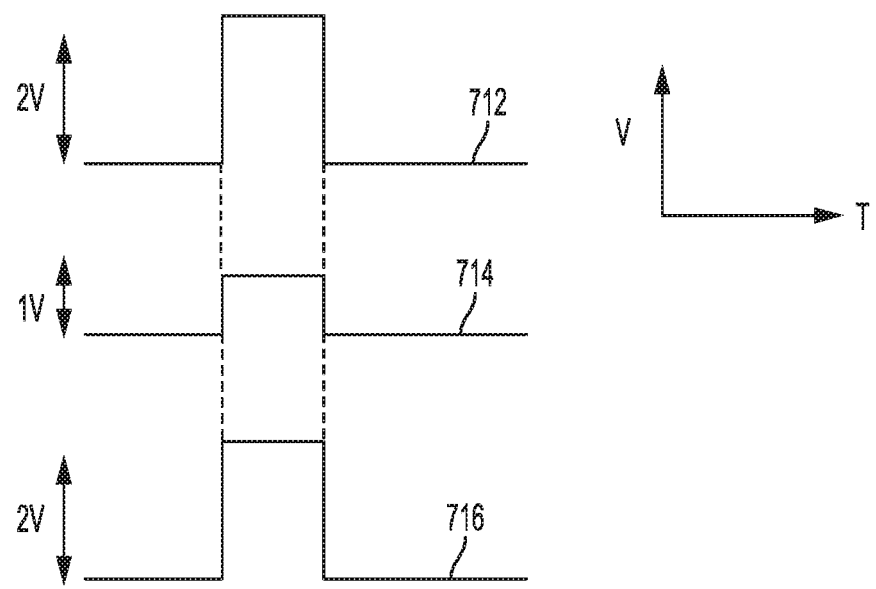

FIGS. 7A and 7B are plots illustrating the adjustability of a Class-D amplifier system according to some embodiments of the disclosure. In FIG. 7A, signal 702 represents a section the reference PWM signal output by the digital PWM driver and received as an input by the first integrator of an analog PWM modulator of this disclosure, and signal 704 represents a section the output PWM signal fed back from a speaker driver and received as an input by the first integrator of an analog PWM modulator of this disclosure. As illustrated in FIG. 7A, the widths and the voltage amplitude levels of signals 702 and 704 are approximately equal to each other. Therefore, when the opposite polarities of the reference PWM signal 702 and the output PWM signal 704 are added together to obtain an error signal, the resulting error signal is approximately equal to zero.

In FIG. 7B, signal 712 represents a section of the output PWM signal fed back from a speaker driver and received as an input by the first integrator of an analog PWM modulator of this disclosure, and signal 714 represents a section of the reference PWM signal output by the digital PWM driver without amplification and received as an input by the first integrator of an analog PWM modulator of this disclosure. Because the voltage amplitude levels of signals 712 and 714 are not approximately the same, when the opposite polarities of the reference PWM signal 714 and the output PWM signal 712 are added together to obtain an error signal, the resulting error signal will not be approximately equal to zero. Signal 716 represents a section of the reference PWM signal output by the digital PWM driver after amplification of the first PWM signal and received as an input by the first integrator of an analog PWM modulator of this disclosure. As illustrated in FIG. 7B, the widths and the voltage amplitude levels of signals 712 and 716 are approximately equal to each other. Therefore, when the opposite polarities of the reference PWM signal 716 and the output PWM signal 712 are added together to obtain an error signal, the resulting error signal is approximately equal to zero.

Figure 8A:
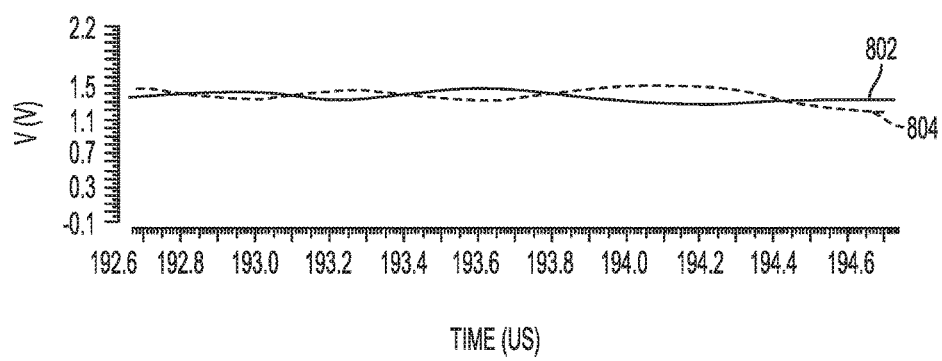
FIGS. 8A and 8B are plots illustrating signals processed within a Class-D amplifier system according to some embodiments of the disclosure.
Figure 8B:
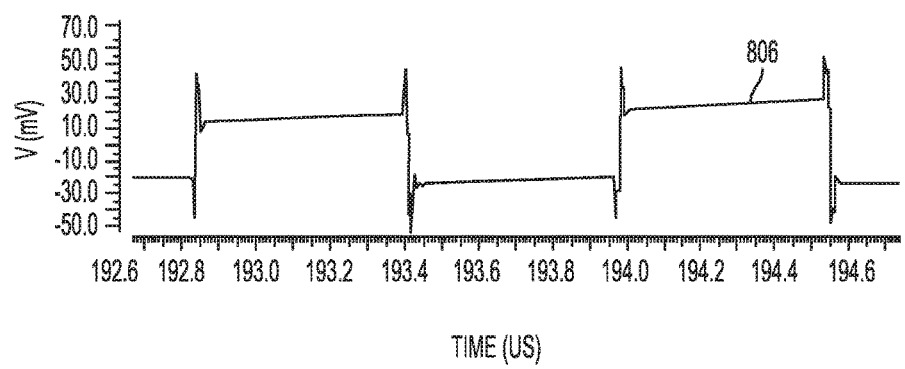

FIGS. 8A and 8B are plots illustrating signals processed within a Class-D amplifier system according to some embodiments of the disclosure. In FIG. 8A, signal 802 represents a first signal of the differential signal output by a first integrator of an analog PWM modulator of this disclosure, and signal 804 represents a second signal of the differential signal output by a first integrator of an analog PWM modulator of this disclosure. Together, signals 802 and 804 form the differential signal output by a first integrator of an analog PWM modulator of this disclosure. FIG. 8B illustrates the single-ended signal 806 that is the single-ended representation of the differential signal output by a first integrator of an analog PWM modulator of this disclosure. In some embodiments, signal 806 represents the error signal at the output of the first integrator when the reference and output PWM signals at the inputs of the first integrator add to each other in such a way that they cancel each other out. As illustrated in FIG. 8B, the error signal can have a peak-to-peak amplitude that is in the range of 0 to 200 mV.

In some embodiments, because the reference and output PWM signals can substantially cancel each other out when their opposite polarities are added together at the input to the first integrator of an analog PWM modulator of this disclosure, the integrators in the analog PWM modulator may not operate on large voltage signals. Instead, the integrators may operate on a small error signal. For example, because the inputs to the first integrator of an analog PWM modulator of this disclosure may be the reference PWM signal and the output PWM signal, the error signal that is the difference between the reference PWM signal and the output PWM signal may be very small, and may result mainly due to the non-linearity of the speaker driver and some path delay.

As a result of the small error signal, the gains of the integrators in an analog PWM modulator of this disclosure can be made higher than would be allowed in conventional Class-D amplifier systems. In certain embodiments, by increasing the gain of the integrators, other advantages may be achieved by a Class-D amplifier system of this disclosure, such as more noise rejection without increasing the area or the power usage of the Class-D amplifier system of this disclosure.

Figure 9:
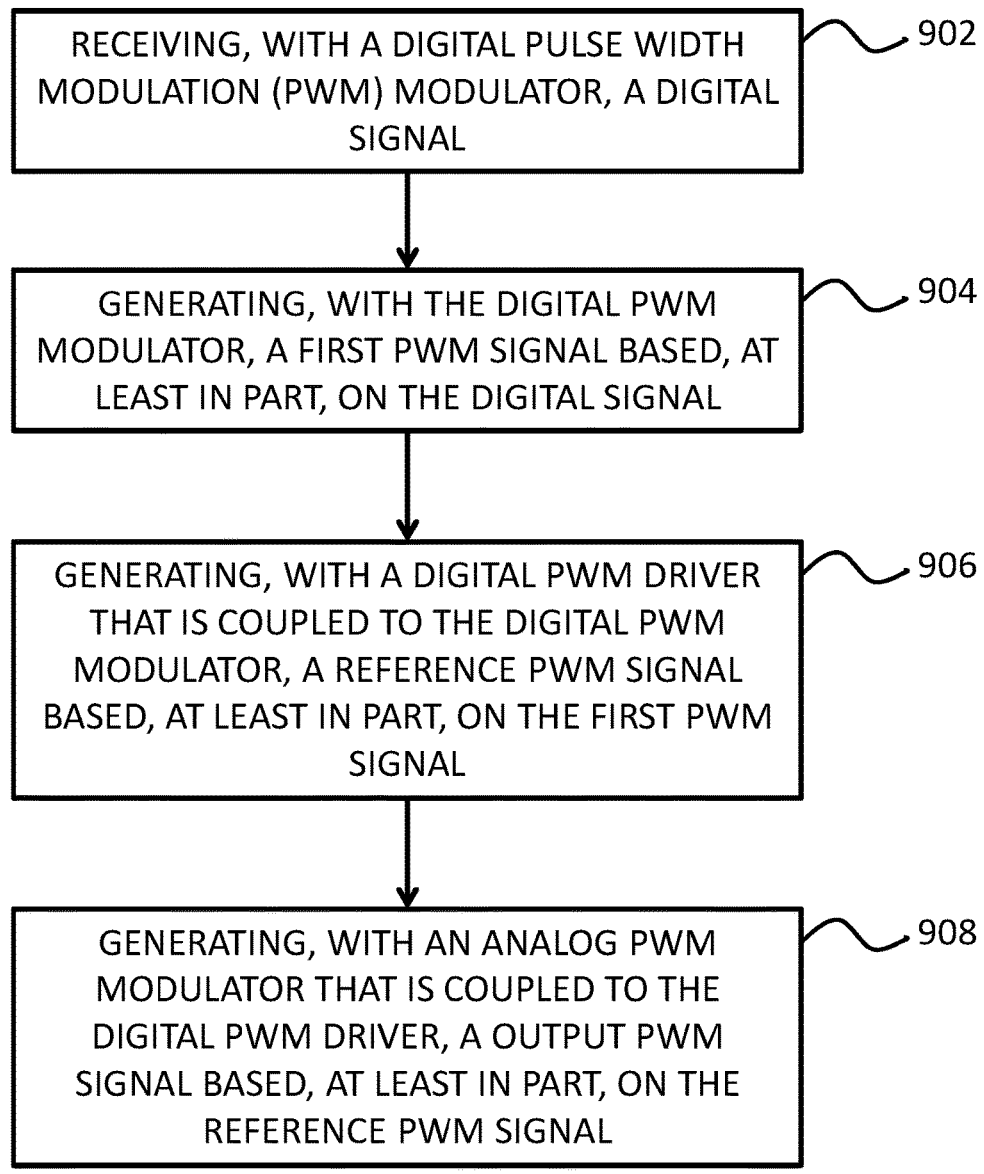
FIG. 9 is a flow chart illustrating an example method for Class-D audio amplification according to one embodiment of the disclosure.

FIG. 9 is a flow chart illustrating an example method for Class-D audio amplification according to one embodiment of the disclosure. Method 900 may be implemented with the systems described in this disclosure or other systems. Method 900 begins, at block 902, with receiving, with a digital PWM modulator, a digital signal. At block 904, a first PWM signal is generated with the digital PWM modulator based, at least in part, on the digital signal. At block 906, a reference PWM signal is generated with a digital PWM driver that is coupled to the digital PWM modulator based, at least in part, on the first PWM signal. At block 908, an output PWM signal is generated with an analog PWM modulator that is coupled to the digital PWM driver based, at least in part, on the reference PWM signal.

The schematic flow chart diagram of FIG. 9 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding methods. Indeed, some arrows or other connectors may be used to indicate only the logical flow of the methods. For instance, an arrow may indicate a waiting or monitoring period of unspecified duration between enumerated steps of the depicted methods. Additionally, the order in which a particular method occurs may or may not strictly adhere to the order of the corresponding steps shown.

Figure 10:
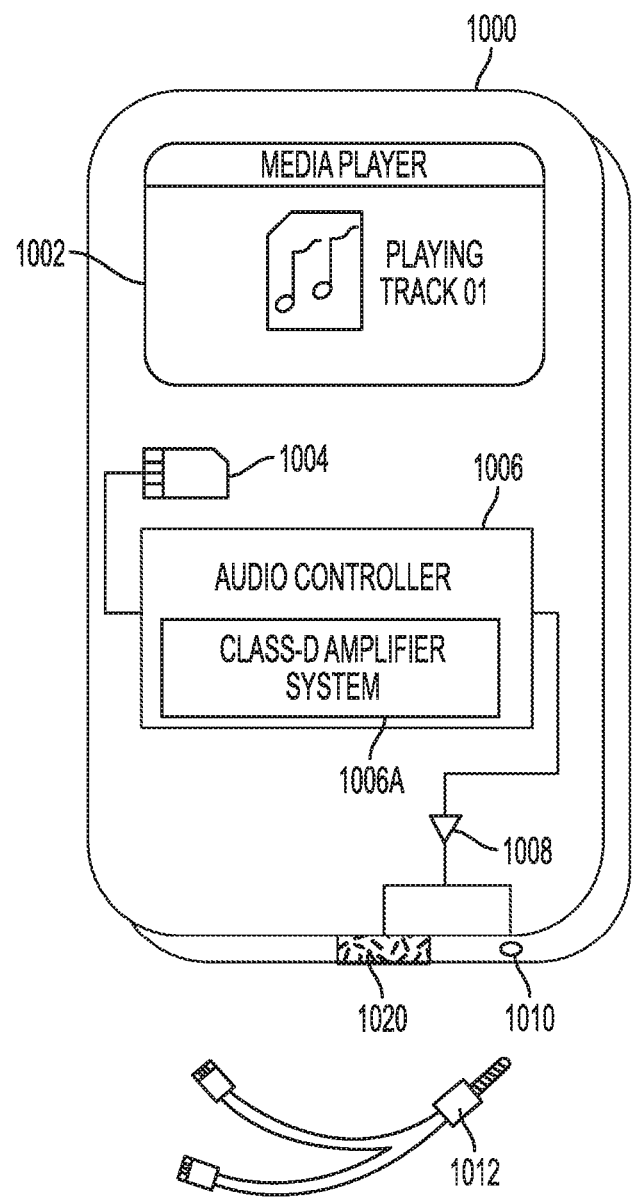
FIG. 10 is an illustration showing an example personal media device for audio playback including an audio controller that is configured to amplify audio signals according to one embodiment of the disclosure.

One advantageous embodiment for an audio processor that includes the audio amplifying systems described herein is a personal media device for playing back music, high-fidelity music, and/or speech from telephone calls. FIG. 10 is an illustration showing an example personal media device for audio playback including an audio controller that is configured to amplify audio signals according to one embodiment of the disclosure. A personal media device 1000 may include a display 1002 for allowing a user to select from music files for playback, which may include both high-fidelity music files and normal music files. When music files are selected by a user, audio files may be retrieved from memory 1004 by an application processor (not shown) and provided to an audio controller 1006. The audio controller 1006 may include a Class-D amplifier system 1006A. The Class-D amplifier system 1006A may implement audio processing to modify an input audio signal, such as according to the embodiments of FIG. 4 or FIG. 5. The output of audio controller 1006 may be amplified by amplifier 1008. In some embodiments, amplifier 1008 may be included within audio controller 1006. The amplifier 1008 may be coupled to an audio output 1010, such as a headphone jack, for driving a transducer, such as headphones 1012. The amplifier 1008 may also be coupled to an internal speaker 1020 of the device 1000. Although the data received at the audio controller 1006 is described as received from memory 1004, the audio data may also be received from other sources, such as an USB connection, a device connected through Wi-Fi to the personal media device 1000, a cellular radio, an Internet-based server, another wireless radio, and/or another wired connection.

The operations described above may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor (e.g., CPU or DSP) capable of executing instructions contained in software. The firmware and/or software may include instructions that cause the processing of signals described herein to be performed. The circuitry or software may be organized as blocks that are configured to perform specific functions. Alternatively, some circuitry or software may be organized as shared blocks that can perform several of the described operations. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although a Class-D amplifier is described in embodiments above, aspects of the disclosed invention may also be applied to other amplifiers. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   a digital pulse width modulation (PWM) modulator that is configured to receive a digital signal and generate a first PWM signal based, at least in part, on the digital signal;
   a digital PWM driver that is coupled to the digital PWM modulator and that is configured to receive the first PWM signal and generate a reference PWM signal based, at least in part, on the first PWM signal; and
   an analog PWM modulator that is coupled to the digital PWM driver and that is configured to receive the reference PWM signal and generate an output PWM signal based, at least in part, on the reference PWM signal.

2. The apparatus of claim 1, wherein the analog PWM modulator is further configured to add opposite polarities of the reference PWM signal and the output PWM signal to generate an error signal.

3. The apparatus of claim 1, wherein the analog PWM modulator is further configured to amplify the amplitude of the reference PWM signal to generate the output PWM signal, wherein an in-band amplitude of the output PWM signal is greater than or equal to the amplitude of the reference PWM signal.

4. The apparatus of claim 1, wherein the digital PWM driver is further configured to amplify the amplitude of the first PWM signal such that the generated reference PWM signal has an amplitude that is approximately equal to the amplitude of the output PWM signal.

5. The apparatus of claim 4, wherein the digital PWM driver is further configured to drive current through at least one of a plurality of resistors that interface between the digital PWM driver and the analog PWM modulator.

6. The apparatus of claim 5, wherein the digital PWM driver is configured to vary the amplification of the amplitude of the first PWM signal by varying the at least one of the plurality of resistors through which current is driven.

7. The apparatus of claim 1, wherein the apparatus is a Class-D amplifier.

8. The apparatus of claim 1, further comprising a reference buffer that is coupled to the digital PWM driver and that is configured to provide power to the digital PWM driver.

9. The apparatus of claim 8, wherein the reference buffer is further configured to have a configurable output supply voltage such that a voltage supplied to the digital PWM driver is configurable.

10. The apparatus of claim 1, wherein at least one of the reference PWM signal and the output PWM signal is a differential signal.

11. The apparatus of claim 1, wherein the output PWM signal is output by a speaker driver within the analog PWM modulator.

12. A method, comprising:
    receiving, with a digital pulse width modulation (PWM) modulator, a digital signal;
    generating, with the digital PWM modulator, a first PWM signal based, at least in part, on the digital signal;
    generating, with a digital PWM driver that is coupled to the digital PWM modulator, a reference PWM signal based, at least in part, on the first PWM signal; and
    generating, with an analog PWM modulator that is coupled to the digital PWM driver, an output PWM signal based, at least in part, on the reference PWM signal.

13. The method of claim 12, further comprising adding opposite polarities of the reference PWM signal and the output PWM signal to generate an error signal.

14. The method of claim 12, further comprising amplifying the amplitude of the reference PWM signal to generate the output PWM signal, wherein an in-band amplitude of the output PWM signal is greater than or equal to the amplitude of the reference PWM signal.

15. The method of claim 12, further comprising amplifying the amplitude of the first PWM signal such that the generated reference PWM signal has an amplitude that is approximately equal to the amplitude of the output PWM signal.

16. The method of claim 15, further comprising driving current through at least one of a plurality of resistors that interface between the digital PWM driver and the analog PWM modulator.

17. The method of claim 16, further comprising varying the amplification of the amplitude of the first PWM signal by varying the at least one of the plurality of resistors through which current is driven.

18. The method of claim 12, wherein the method is performed within a Class-D amplifier.

19. The method of claim 12, further comprising providing power to the digital PWM driver.

20. The method of claim 19, wherein the power provided to the digital PWM driver is configurable.

21. The method of claim 12, wherein at least one of the reference PWM signal and the output PWM signal is a differential signal.

22. The method of claim 12, wherein the output PWM signal is output by a speaker driver within the analog PWM modulator.

23. An apparatus, comprising:
an audio controller configured to perform steps comprising:
- receiving, with a digital pulse width modulation (PWM) modulator, a digital signal;
- generating, with the digital PWM modulator, a first PWM signal based, at least in part, on the digital signal;
- generating, with a digital PWM driver that is coupled to the digital PWM modulator, a reference PWM signal based, at least in part, on the first PWM signal; and
- generating, with an analog PWM modulator that is coupled to the digital PWM driver, an output PWM signal based, at least in part, on the reference PWM signal.

24. The apparatus of claim 23, wherein the audio controller is further configured to perform the step of adding opposite polarities of the reference PWM signal and the output PWM signal to generate an error signal.

25. The apparatus of claim 23, wherein the audio controller is further configured to perform the step of amplifying the amplitude of the reference PWM signal to generate the output PWM signal, wherein an in-band amplitude of the output PWM signal is greater than or equal to the amplitude of the reference PWM signal.

26. The apparatus of claim 23, wherein the audio controller is further configured to perform the step of amplifying the amplitude of the first PWM signal such that the generated reference PWM signal has an amplitude that is approximately equal to the amplitude of the output PWM signal.

27. The apparatus of claim 26, wherein the audio controller is further configured to perform the step of driving current through at least one of a plurality of resistors that interface between the digital PWM driver and the analog PWM modulator.

28. The apparatus of claim 27, wherein the audio controller is further configured to perform the step of varying the amplification of the amplitude of the first PWM signal by varying the at least one of the plurality of resistors through which current is driven.

* * * * *